US006200145B1

(12) United States Patent
Harting et al.

(10) Patent No.: US 6,200,145 B1
(45) Date of Patent: Mar. 13, 2001

(54) ELECTRICAL PLUG CONNECTOR

(75) Inventors: Dietmar Harting, Espelkamp; Günter Pape, Enger; Karin Förster, Lübbecke, all of (DE)

(73) Assignee: Harting KGaA (DE)

( * ) Notice: Subject to any disclaimer, the term of this patent is extended or adjusted under 35 U.S.C. 154(b) by 0 days.

(21) Appl. No.: 09/427,468

(22) Filed: Oct. 26, 1999

(30) Foreign Application Priority Data

Nov. 13, 1998 (DE) .............................................. 198 52 290

(51) Int. Cl.[7] .......................... H01R 12/00; H01R 29/00; H05K 1/00

(52) U.S. Cl. ............................................... 439/78; 439/170

(58) Field of Search ................................ 439/78, 65, 170, 439/353, 354, 357

(56) References Cited

U.S. PATENT DOCUMENTS 4,655,518 * 4/1987 Johnson ................................ 439/62
4,686,607 * 8/1987 Johnson .............................. 361/413
5,575,690 * 11/1996 Eaton ................................. 439/717

FOREIGN PATENT DOCUMENTS

405135838 * 6/1993 (JP) .

OTHER PUBLICATIONS

Harting New Product Information, Mar. 1998, Harting KGaA, Espelkamp, Germany.

* cited by examiner

*Primary Examiner*—Brian Sircus
*Assistant Examiner*—Chandrika Prasad
(74) *Attorney, Agent, or Firm*—Cook, Alex, McFarron, Manzo, Cummings & Mehler, Ltd.

(57) ABSTRACT

For an electrical plug connector for printed circuit boards, in particular rear-wall plug connectors with a frame-shaped insulating body in which pin-shaped contact elements are disposed in columns and rows, the insulating body being constructed for receiving multi-row spring strips, it is proposed that an adapter, in which a 3-row spring strip can be inserted, be latched into the insulating body.

7 Claims, 8 Drawing Sheets

ELECTRICAL PLUG CONNECTOR

Figure 1:
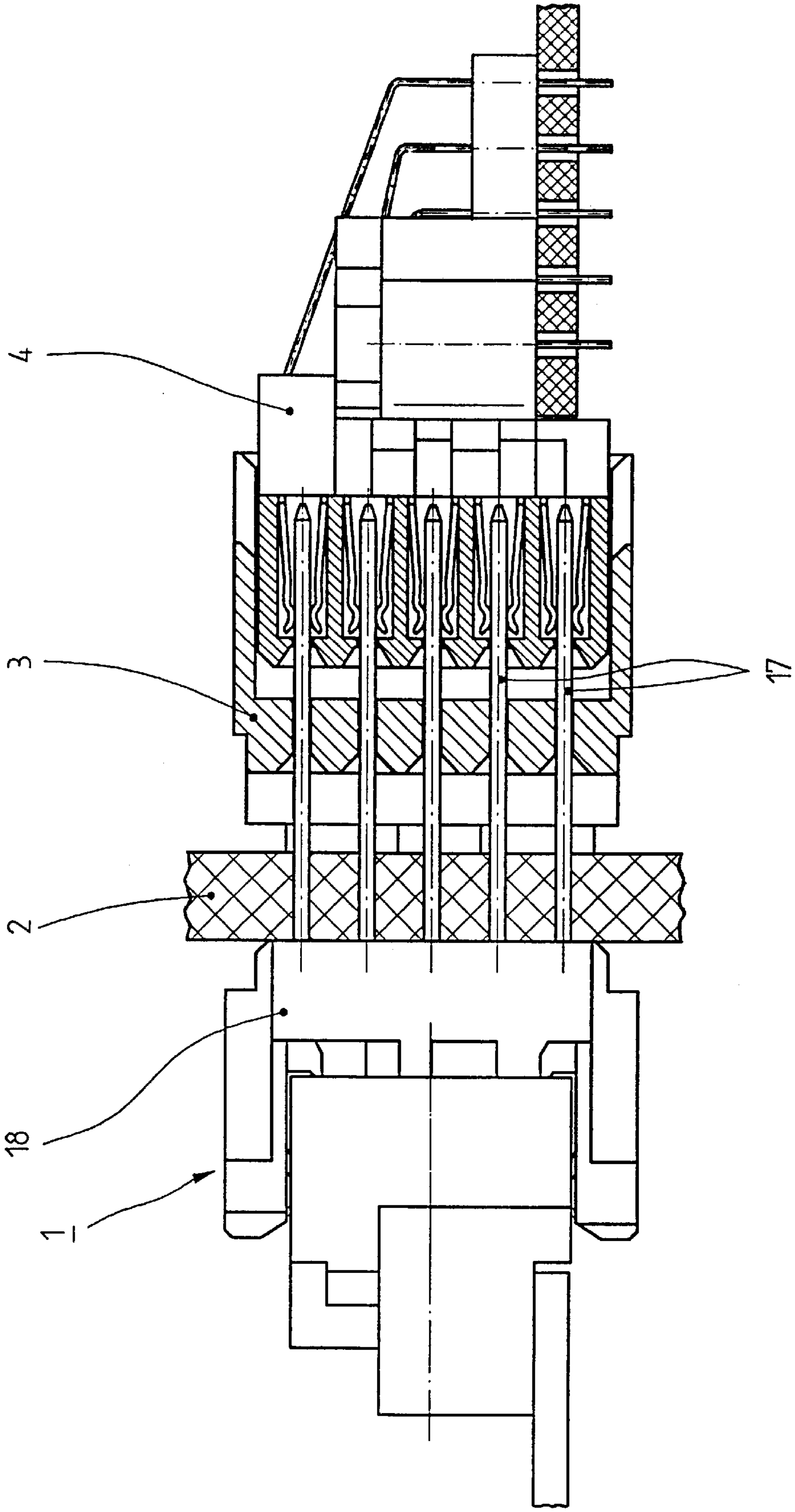
Fig. 1 PRIOR ART

The invention relates to an electrical plug connector for printed circuit boards, in particular for rear-wall plug connectors with a frame-shaped insulating body in which contact elements are disposed in columns and rows, it being possible for connecting posts belonging to the contact elements, which posts project out of the insulating body, to be slipped through bores in the circuit board, and for a transfer frame which is constructed for receiving and mechanically retaining multi-row spring strips to be slipped onto the said connecting posts, and the said invention also relates to an electrical plug connector for printed circuit boards, in particular rear-wall plug connectors with a frame-shaped insulating body in which blade contacts are disposed in columns and rows, the said insulating body being constructed for receiving and mechanically retaining multi-row spring strips.

A plug connector of this type is known from the company document "HARTING—New Product Information" (harbus), March 1998.

In the case of the known, commercial 5-row blade strips (plug connectors), it is not possible to also plug in 3-row spring strips in a mechanically stable manner.

The underlying object of the invention is therefore to construct an electrical plug connector of the initially mentioned type in such a way that 3-row or 5-row spring strips can be inserted alternatively in a 5-row blade-type plug connector.

This object is achieved through the fact that an adapter, in which a 3-row spring strip can be inserted, is latched into the casing of the 5-row blade-type plug connector or into the transfer frame.

Advantageous refinements of the invention are indicated in claims 3 to 6.

The advantages achieved with the aid of the invention consist, in particular, in the fact that a transfer frame designed for a 5-row spring strip can also be fitted with a 3-row spring strip, and reverse compatibility is still ensured thereby and conversion from a 3-row to a 5-row system in a simple manner is made possible for the user.

Figure 2:
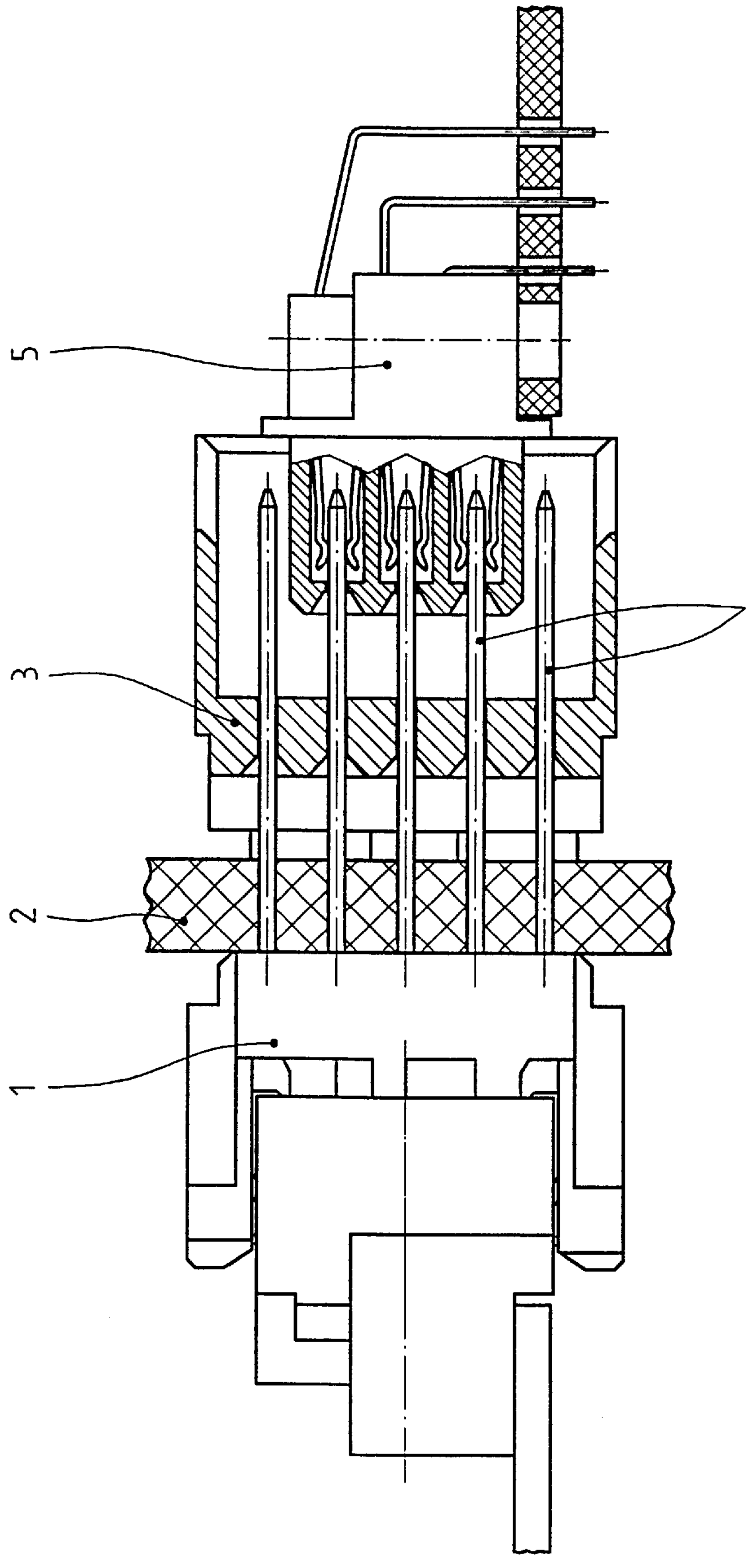
Fig. 2 PRIOR ART
Figure 3:
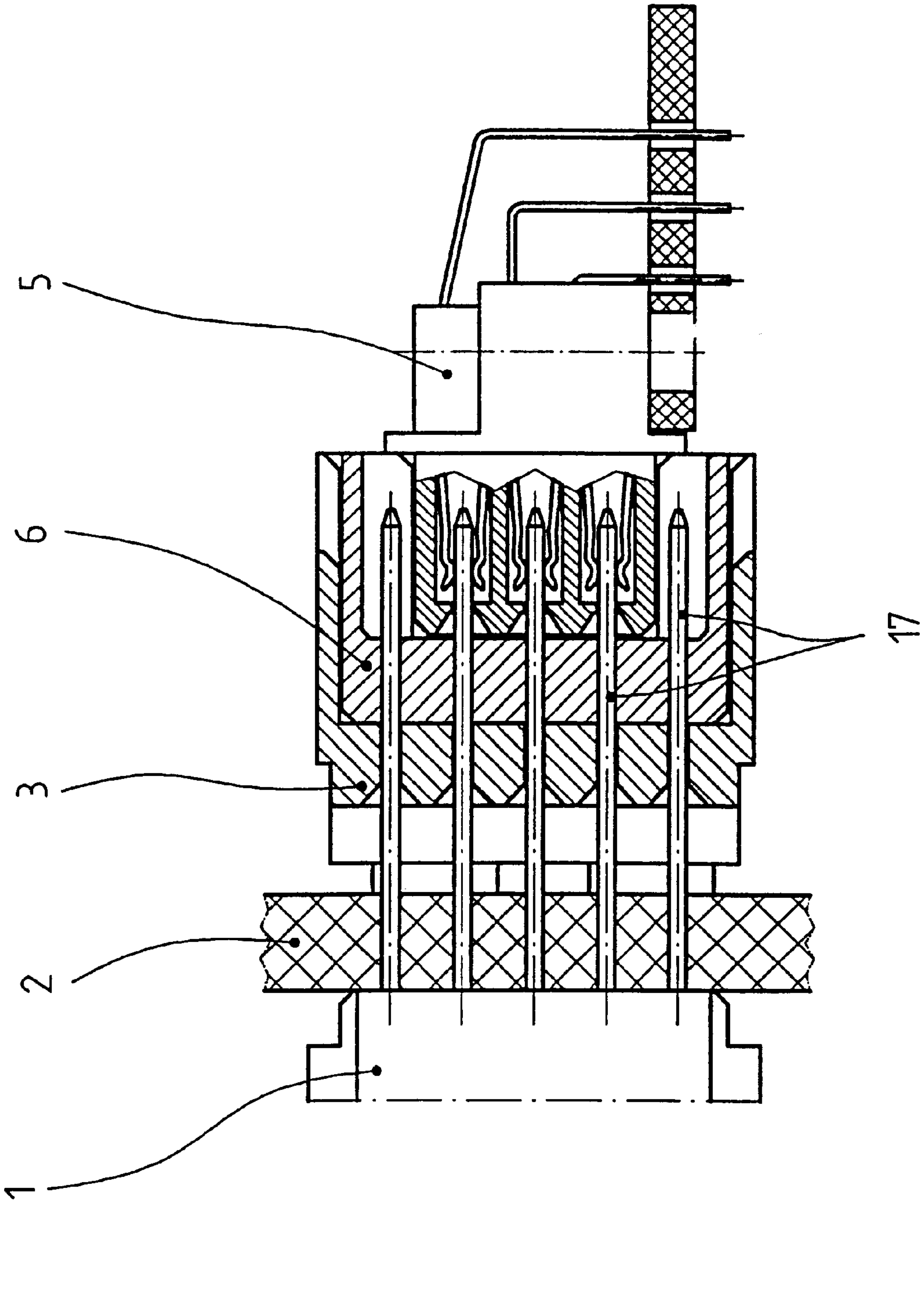
Figure 4:
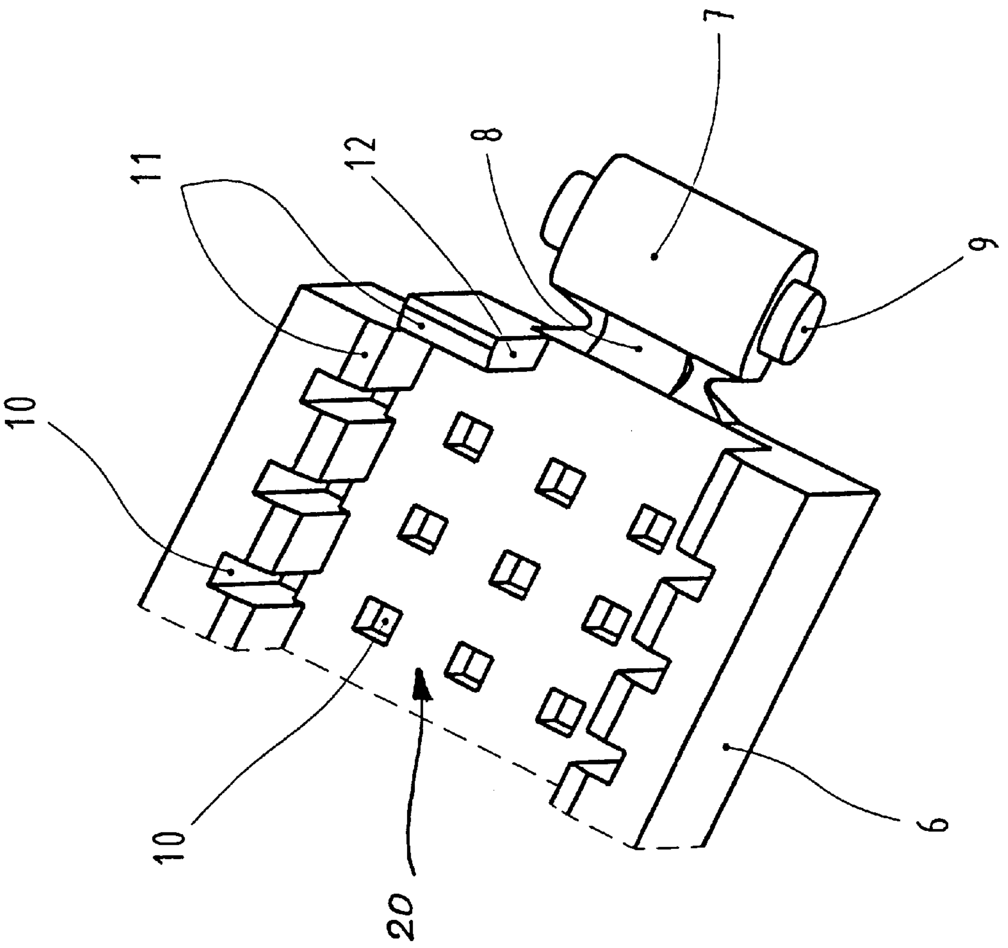
Figure 5:
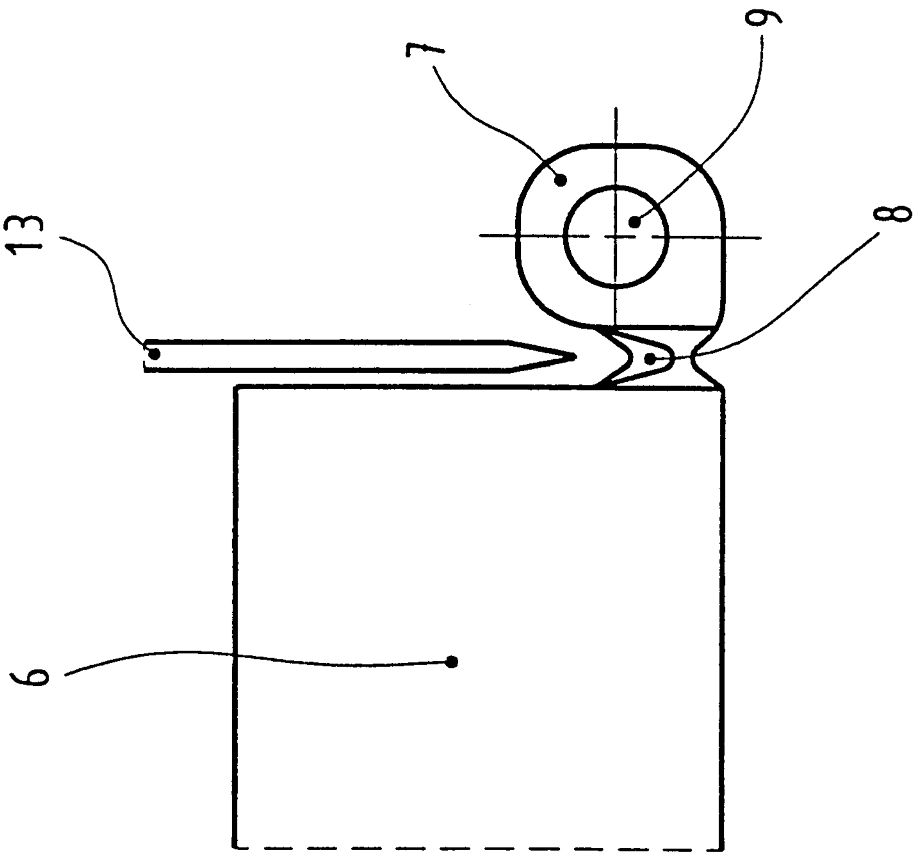
Figure 6:
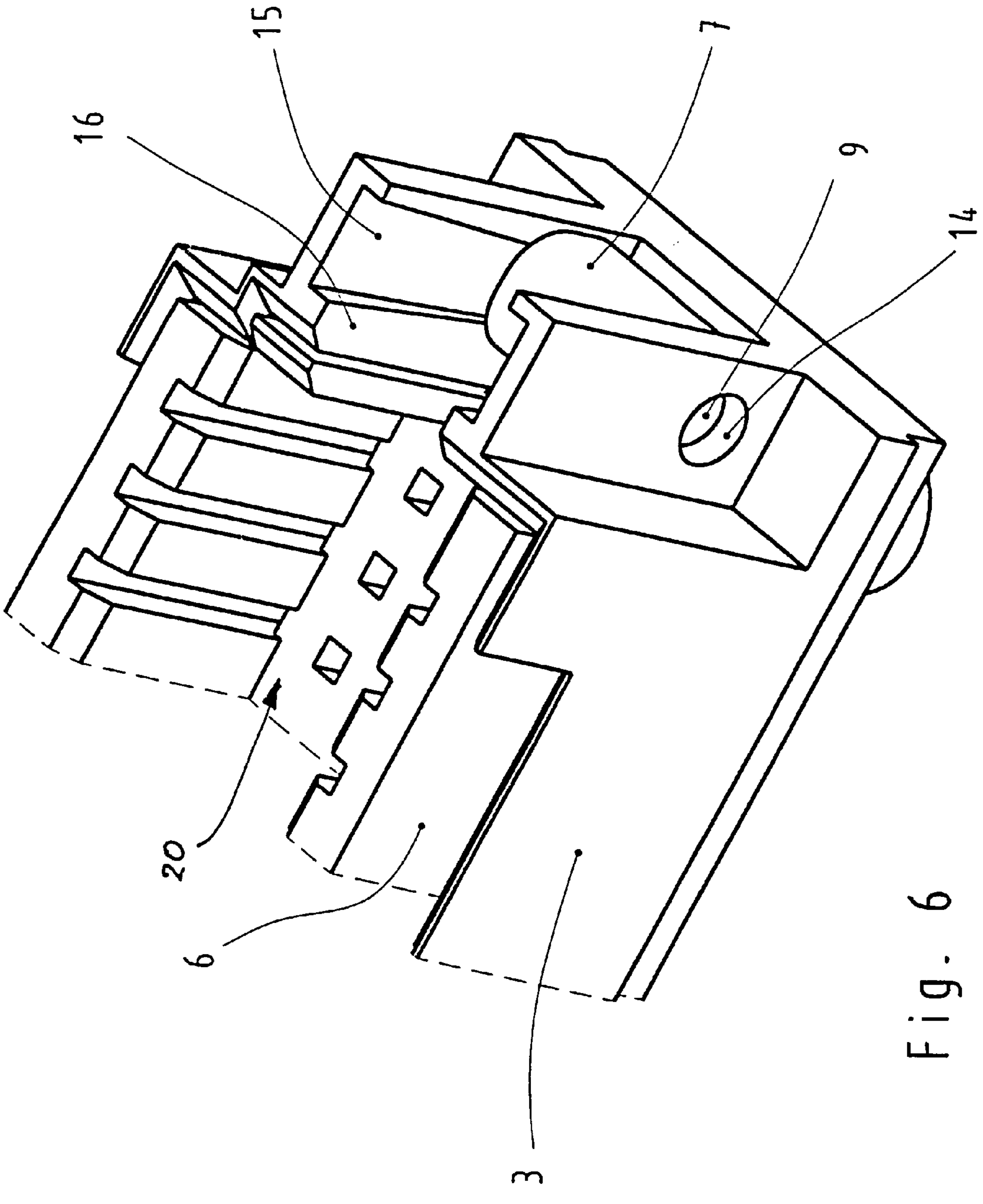
Figure 7:
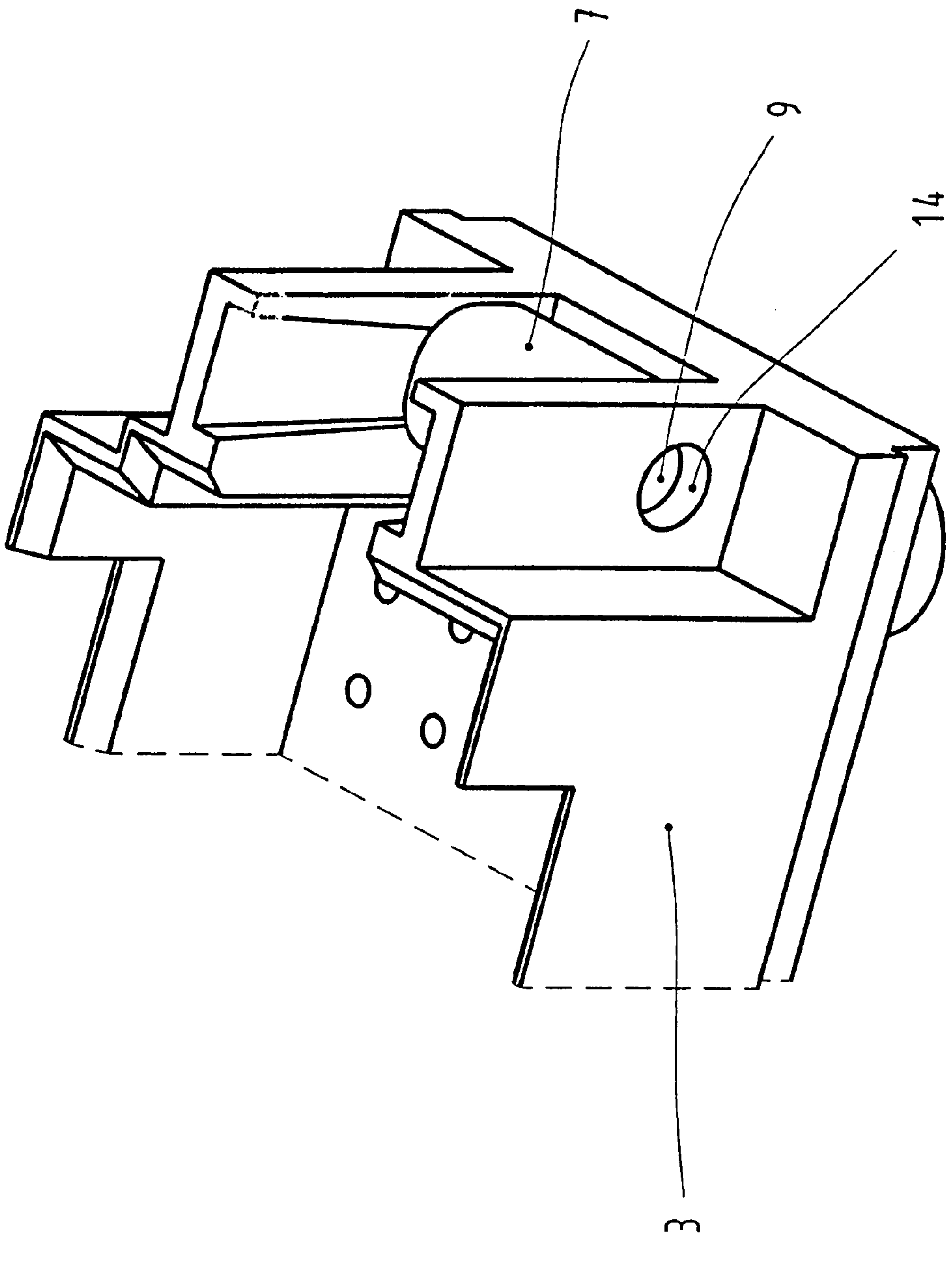
Figure 8:
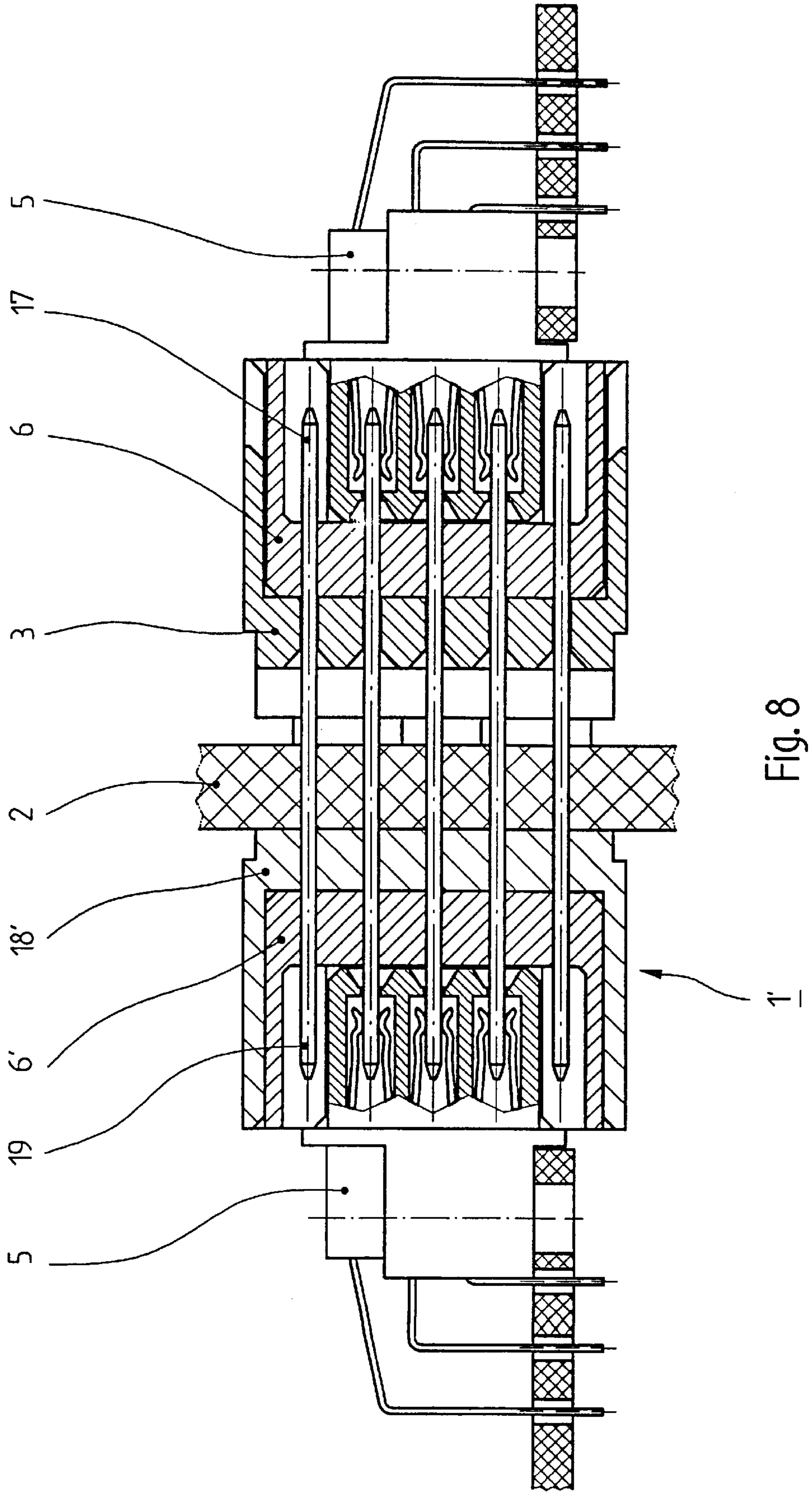

An exemplified embodiment of the invention is represented in the drawings and will be explained in greater detail below. In the drawings:

FIG. 1 shows a sectional view of a commercial 5-row plug connection,

FIG. 2 shows a sectional view of a plug connection with a 3-row spring strip which is inserted, without an adapter, in a 5-row plug connection, FIG. 3 shows a sectional view of a plug connection with a 3-row spring strip, an adapter being inserted in the 5-row plug connection, FIG. 4 shows a partial view of the flange of the adapter, FIG. 5 shows a partial view of the flange of the adapter according to FIG. 4, with a preset breaking point on the flange, FIG. 6 shows a perspective representation of a transfer frame with an adapter inserted, FIG. 7 shows a perspective representation of the transfer frame in which a flange has been left behind after being severed, and FIG. 8 shows a sectional view of a 5-row plug connection, in which both connecting sides of a rearward circuit board are constructed for receiving spring strips.

Represented in FIG. 1 is a sectional view of a known, commercial 5-row plug connection which serves to electrically connect circuit boards on a rearward circuit board.

Under these circumstances, the rearward circuit board 2 is provided with a standard 5-row rear-wall plug connector 1, in the frame-shaped insulating body 18 of which contact elements are disposed in columns and rows, the long connecting posts 17 of the said elements being guided through bores in the circuit board 2 onto which a transfer frame 3 is slipped. Plugged into the said transfer frame is a 5-row spring strip 4 with a daughter board, electrical contact with the spring contact elements thereof being made with the aid of the pin-shaped connecting posts.

In FIG. 2, as a variation on FIG. 1 and in order to explain the invention, a 3-row spring strip 5 is pushed into the 5-row plug connection in the transfer frame 3 over the middle rows of pins. With an embodiment of this kind, however, the greatest care must be exercised when plugging in the spring strip 5, by slipping the said spring strip onto the middle rows of pins in an accurate manner.

The solution according to the invention, in which an adapter 6 is latched into the transfer frame 3 of the known 5-row plug connection, is represented in FIG. 3. A 3-row, angled spring strip 5 is, in turn, inserted in the said adapter in a polarized manner. Under these circumstances, the outer dimensions of the adapter 6 correspond to the aperture in the 5-row transfer frame 3, and the inner dimensions of the recess in the adapter correspond to the outer dimensions of the 3-row spring strip 5.

In addition, the adapter 6 is designed in such a way that it contains, as a whole, the apertures for all the connecting posts 17, and that, of the five rows which are present in all, the middle three rows are used for an electrical connection, while the two outer rows are guided in the bores incorporated in a corresponding manner in the outer walls of the insulated casing of the adapter 6.

Represented in perspective in FIG. 4 is a lateral detail of the adapter 6, in which the apertures 10 for the pins of the 5-row plug connector are incorporated, namely in such a way that the three middle rows are situated in the base of the interior 20 and the two outer rows lie inside the outer walls of the adapter 6.

For simplified introduction of a 3-row spring strip 5 into the adapter 6, the latter is provided, on the inside of the interior 20, with a bevel, a receiving region 11 constructed all the way round. Also provided on the narrow sides of the adapter 6 are polarization means 12, which serve for the non-reversible insertion of the 3-row spring strip 5 in the transfer frame 3, and a flange 7 provided with latching knobs 9 is attached in the lateral outer region of the adapter 6.

FIG. 5 shows a lateral representation of the adapter 6, namely with the flange 7 and a latching knob 9 and also with a preset breaking point 8 and a separating tool 13 for severing the flange. The said preset breaking point is formed by a connection, which is thin in terms of material, between the flange 7 and the body of the adapter. The flange can thereby be easily and simply severed from the body of the adapter as a result of the action of a separating tool 13 such as a screwdriver for example, if the adapter is to be removed from the plug connector or the transfer frame if need be.

FIG. 6 shows, in perspective, a detail of a 5-row transfer frame 3 in which an adapter 6 is inserted. In this connection, it can be seen that the flange 7 is inserted, with its latching knobs 9, in the guide region 15 for the said latching knobs, and the latter are latched into the latching holes 14.

If there is a need to exchange a 3-row spring strip for a 5-row one, the adapter 6 can easily be removed from the transfer frame 3 again. In this case, the preset breaking point 8 is acted upon with the aid of a separating tool introduced into a corresponding recess 16 in the transfer frame, and the flange 7 is severed from the adapter 6 so that the latter can be removed. Under these circumstances, the flange itself, which is held via its latching knobs 9, which are latched into the latching holes 14 in the insulating body, and thereby in the transfer frame, is left behind in the transfer frame, as is represented in FIG. 7.

FIG. 8 shows, in a sectional view, a 5-row plug connection in which both connecting sides are constructed to receive spring strips 5. In this instance, an adapter 6' is also inserted in the frame-shaped insulating body 18' of the plug connector (1'). This adapter is substantially constructed in a manner corresponding to the adapter 6 described above, although the flange is slightly modified if need be and adapted to the plug-in region of this plug connector.

In this embodiment, it is possible, when the adapter 6' is not inserted or has been removed, for a 5-row spring strip to be slipped onto the blade contacts 19 of the plug connector (1'), and with the adapter 6' inserted, it is also possible, as represented, for a 3-row spring strip to be slipped on from this side of the circuit board 2.

What is claimed is:

1. An electrical plug connector for printed circuit boards, for rear-wall plug connectors (1) having a frame-shaped insulating body (18) in which contact elements are disposed in columns and rows, connecting posts (17) projecting out the insulating body and passing through bores in a circuit board (2), a transfer frame (3) which is constructed for receiving and mechanically retaining 5-row spring strips (4), said 5-row spring strips insertable into the transfer frame for electrical contact between said spring strips and said connecting posts, and an adapter (6), said adapter being insertable into the transfer frame (3) for latching therewith such that a 3-row spring strip (5) can be inserted therein.

2. An electrical plug connector 1 for printed circuit boards, having a frame-shaped insulating body (18') in which blade contacts (19) are disposed in columns and rows, said insulating body being constructed for receiving and mechanically retaining 5-row spring strips (4), and an adapter (6'), said adapter being insertable into the insulating body (18') for latching therewith such that a 3-row spring strip (5) can be inserted therein.

3. The electrical plug connector according to claim 1, wherein a flange (7) is provided on the adapter (6), said flange having latching knobs (9) and a preset breaking point (8), said latching knobs on the flange (7) being latched into latching holes (14) in the transfer frame (3), said preset breaking point providing for removal of the adapter from the transfer frame.

4. The Electrical plug connector according to claim 3, characterized in that the adapter is provided with polarization means (12).

5. The Electrical plug connector according to claim 3, characterized in that the adapter is provided with a receiving region (11).

6. The Electrical plug connector according to claim 3, characterized in that the adapter is provided with apertures (10) through which the connecting posts (17) of the plug connector (1, 1') are guided.

7. The electrical plug connector according to claim 2, wherein a flange (7) is provided on the adapter (6'), said flange having latching knobs (9) and a preset breaking point (8), said latching knobs on the flange (7) being latched into latching holes (14) in a plug-in region of the plug connector (1') when said flange is inserted into the plug-in region, such that insertion of the flange into the plug-in region provides securing of the adapter to the frame-shaped insulating body (18'), said preset breaking point providing for removal of the adapter from the frame-shaped insulating body (18').

* * * * *